(12) United States Patent
Atakov et al.

(10) Patent No.: US 6,245,996 B1
(45) Date of Patent: Jun. 12, 2001

(54) ELECTRICAL INTERCONNECT STRUCTURE HAVING ELECTROMIGRATION-INHIBITING SEGMENTS

(75) Inventors: Eugenia Atakov, Acton; Adam Shepela, Bolton; Lawrence Bair, Littleton; John Clement, Westboro; Bruce Gieseke, Ashland, all of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/316,916

(22) Filed: May 20, 1999

Related U.S. Application Data

(63) Continuation of application No. 08/722,532, filed on Sep. 27, 1996, now abandoned.

(51) Int. Cl.[7] .................................. H01B 1/00; H05K 1/00
(52) U.S. Cl. .................. 174/68.1; 174/250; 174/255; 174/257
(58) Field of Search ................................ 174/68.1, 250, 174/126.2, 255, 257

(56) References Cited

U.S. PATENT DOCUMENTS

| | | | |
|---|---|---|---|
| 4,296,424 | * 10/1981 | Shibasaki et al. | 338/32 R |
| 4,861,640 | 8/1989 | Gurol | 29/852 X |
| 5,329,695 | 7/1994 | Traskos et al. | 29/852 X |
| 5,363,550 | 11/1994 | Aitken et al. | 29/852 X |
| 5,439,731 | * 8/1995 | Li et al. | 428/209 |
| 5,600,884 | 2/1997 | Kondo et al. | 29/852 |
| 5,663,102 | 9/1997 | Park | 438/626 |
| 5,666,722 | 9/1997 | Tamm et al. | 29/852 X |
| 5,745,984 | 5/1998 | Cole, Jr. et al. | 29/852 X |
| 5,760,476 | 6/1998 | Varker et al. | 257/767 |
| 5,889,233 | * 3/1999 | Shimoto et al. | 174/250 |
| 5,973,402 | * 10/1999 | Shinriki et al. | 257/768 |

OTHER PUBLICATIONS

"Electromigration in Thin Aluminum Films on Titanium Nitride," Journal of Applied Physics, vol. 47, No. 4, Apr. 1976, pp. 1203–1208.

(List continued on next page.)

*Primary Examiner*—Jeffrey Gaffin
*Assistant Examiner*—Kamand Cuneo
(74) *Attorney, Agent, or Firm*—Sharp, Comfort & Merrett, P.C.

(57) ABSTRACT

An integrated circuit is formed having electrical conductors with electromigration-inhibiting/electrically conductive plugs disposed between electrically conductive segments of the electrical conductor. Windows are formed within a planar surface. An electromigration-inhibiting/electrically conductive material is deposited over the planar surface and through the windows to fill the windows and thereby provide, in such windows, plugs of electromigration-inhibiting/electrically conductive material. Portions of the electromigration-inhibiting/electrically conductive material are removed to form the plugs with surfaces co-planar a surface surrounding the plugs. The electrical conductive segments are formed within the same planar surface as the plugs, either before, or after, the plug formation. The electrical conductive segments have surfaces co-planar with the plugs, are aligned with and electrically interconnected through the plugs. The plugs are formed at a distance less than, or equal to, the predetermined critical length, $L_c$, from each other.

12 Claims, 13 Drawing Sheets

OTHER PUBLICATIONS

"An Increase of the Electromigration Reliability of OHMIC Contacts by Enhancing Backflow Effect," Institute of Electrical Engineers (IEEE), 1995, Zhang, W. Et AL., pp. 365–370.

"Evidence of the Electromigration Short–Length Effect in Aluminum–Based Metallurgy with Tungsten Diffusion Barriers," Mat. Res. Soc. Symp. Proc., vol. 309, 1993 Materials Research Society, pp. 141–149.

"Two Electromigration Failure Modes in Polycrystalline Aluminum Interconnects," Institute of Electrical Engineers (IEEE), 1994, Atakov, E.M., Et Al., pp. 213–224.

"Permitted Electromigration of Tungsten–Plug Vias in Chain for Test Structure Wit Short Inter–Plug Distance," VMIC Conference; Jun. 7–8, 1994; pp. 266–272.

* cited by examiner

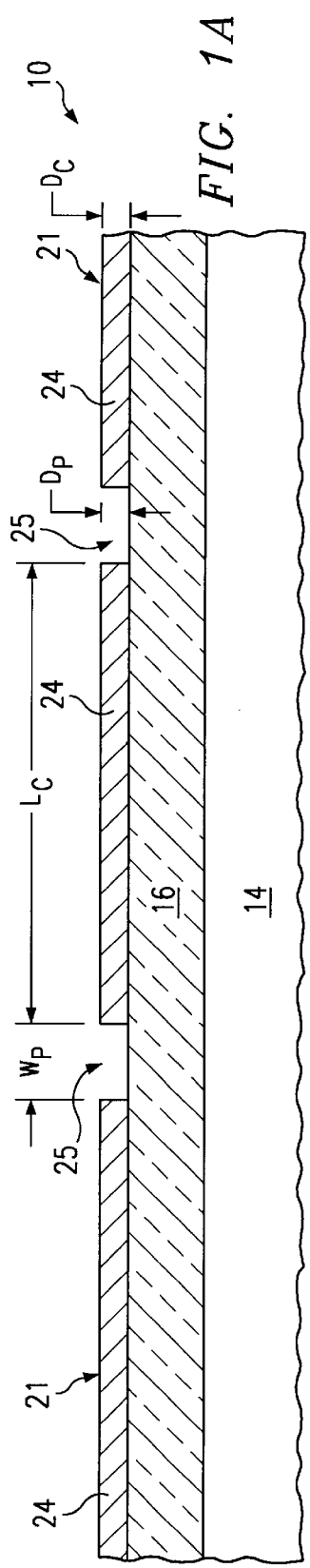
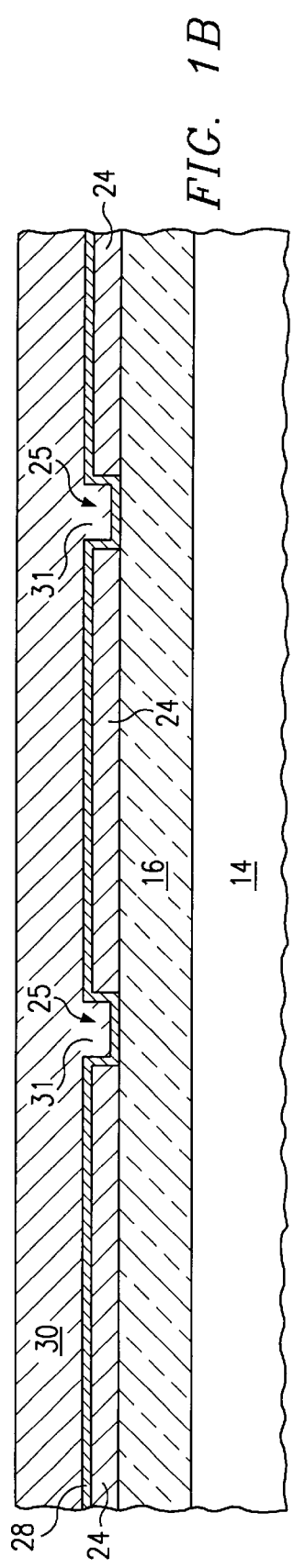
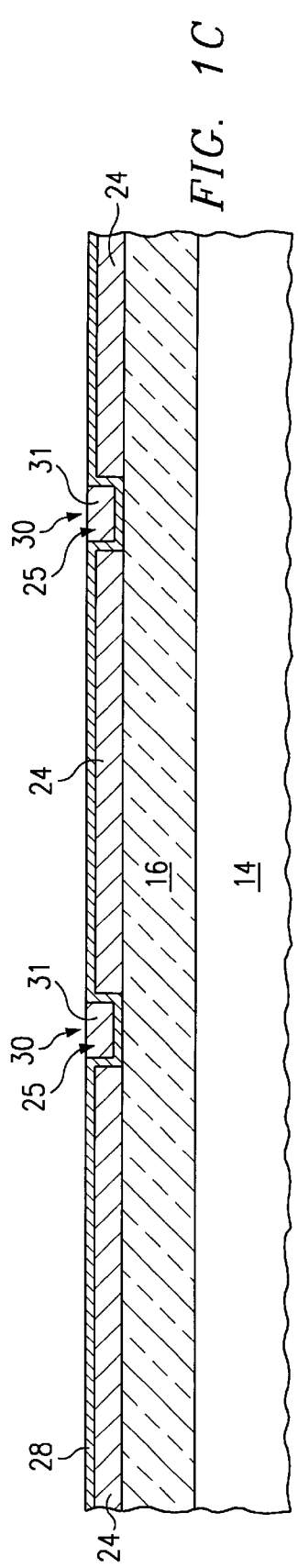

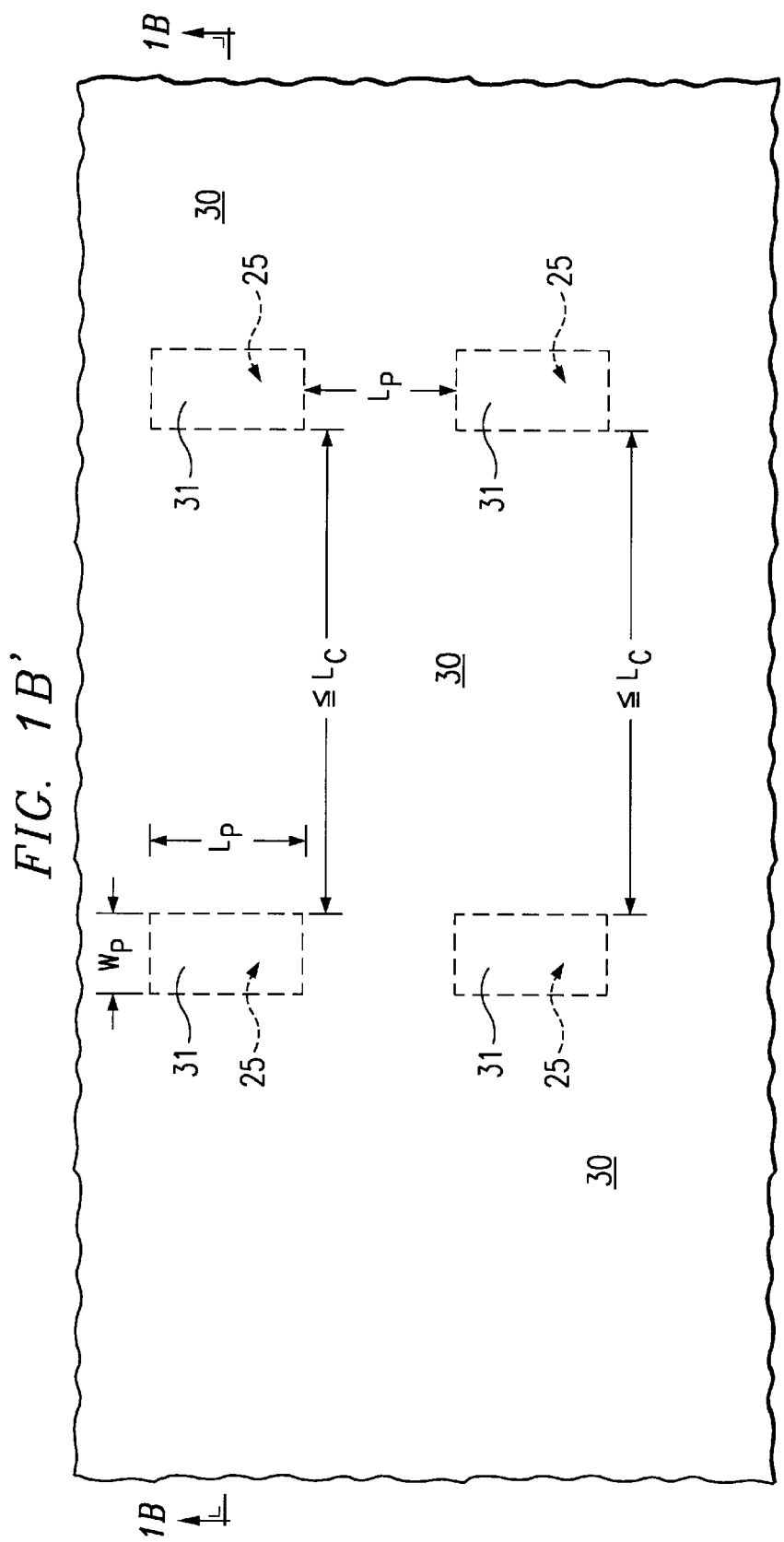

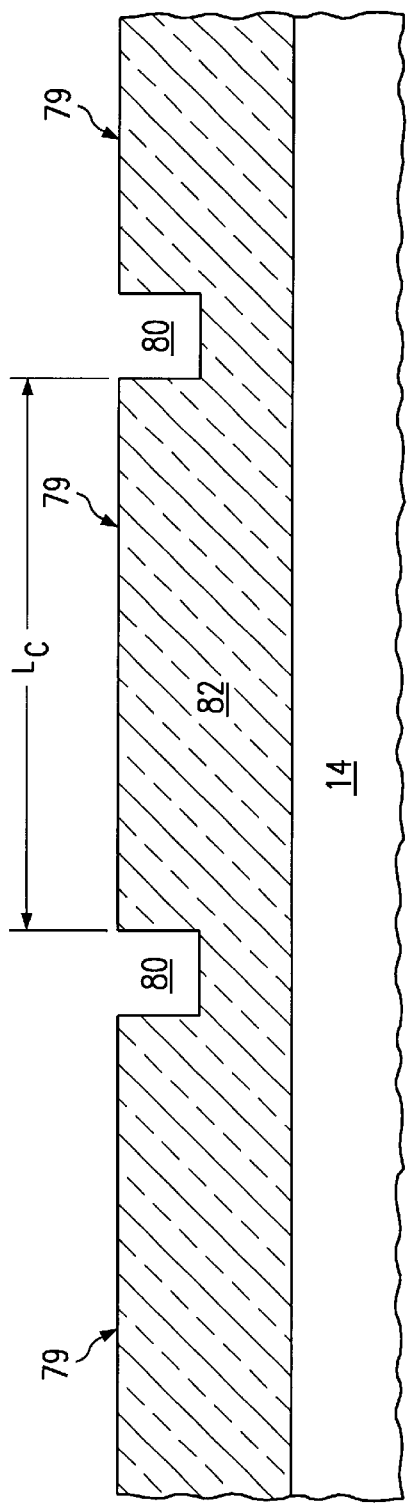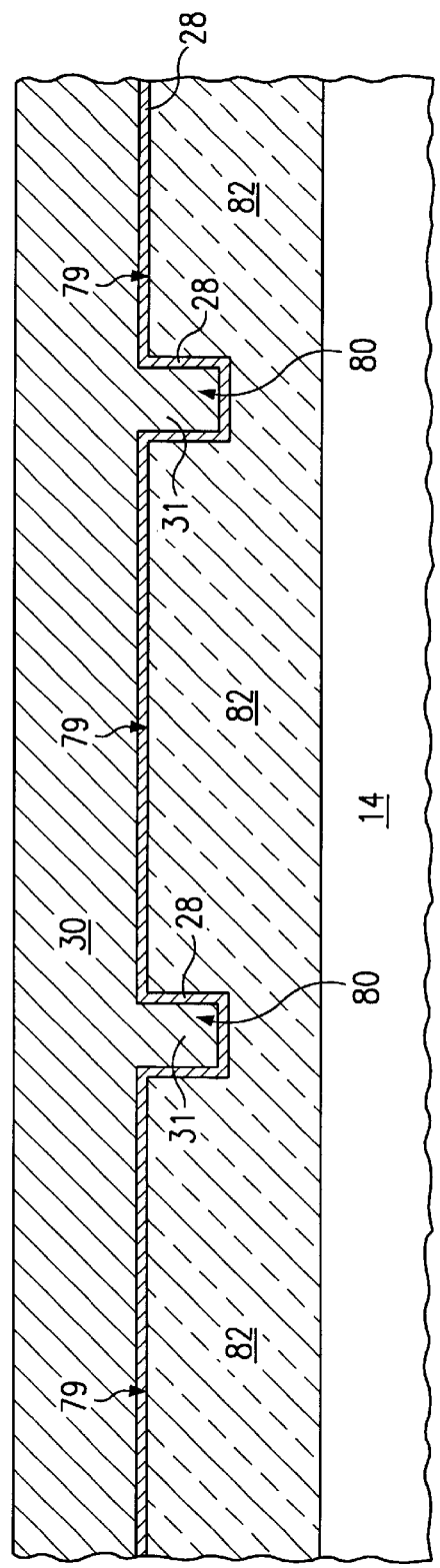

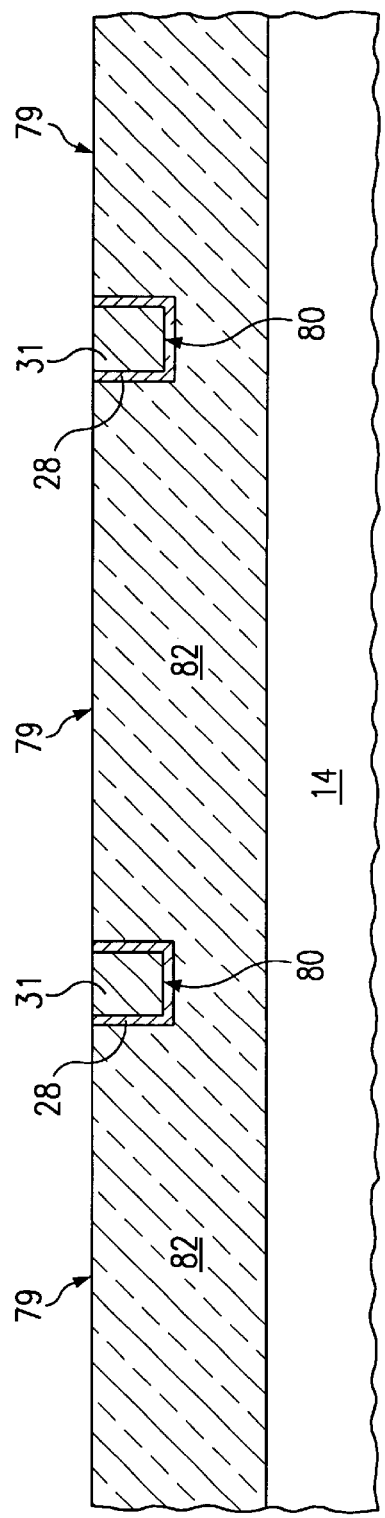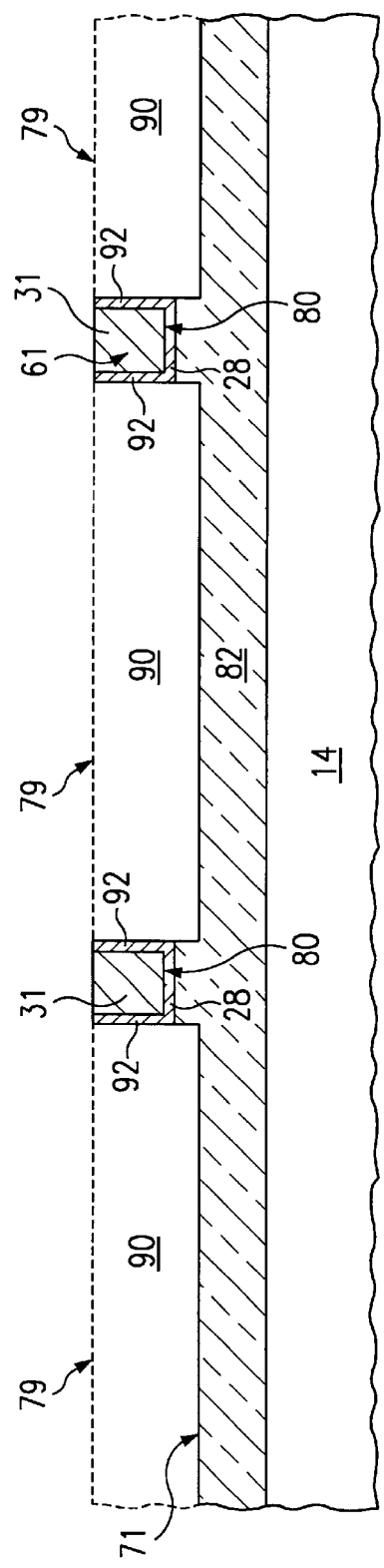

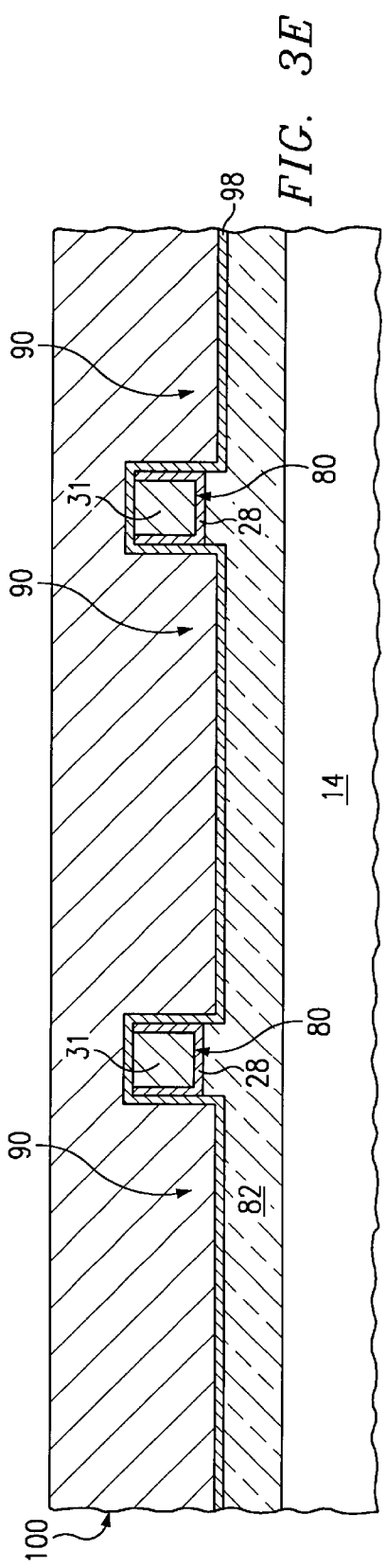
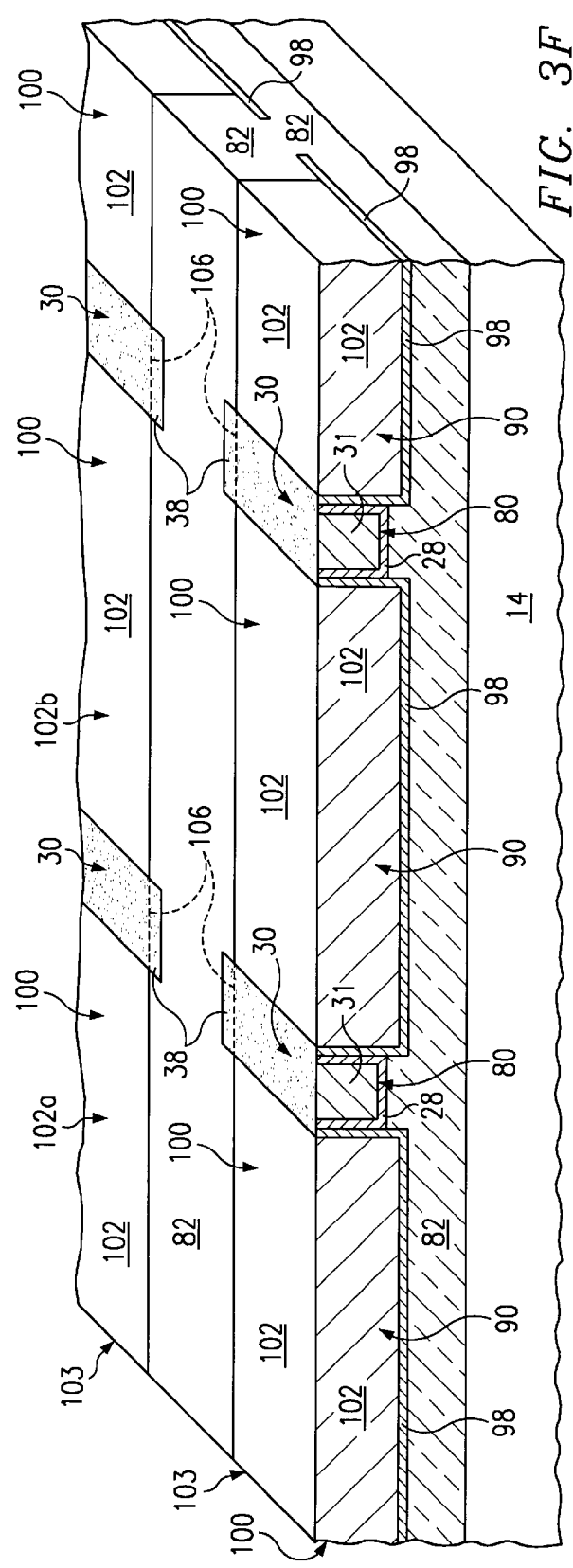

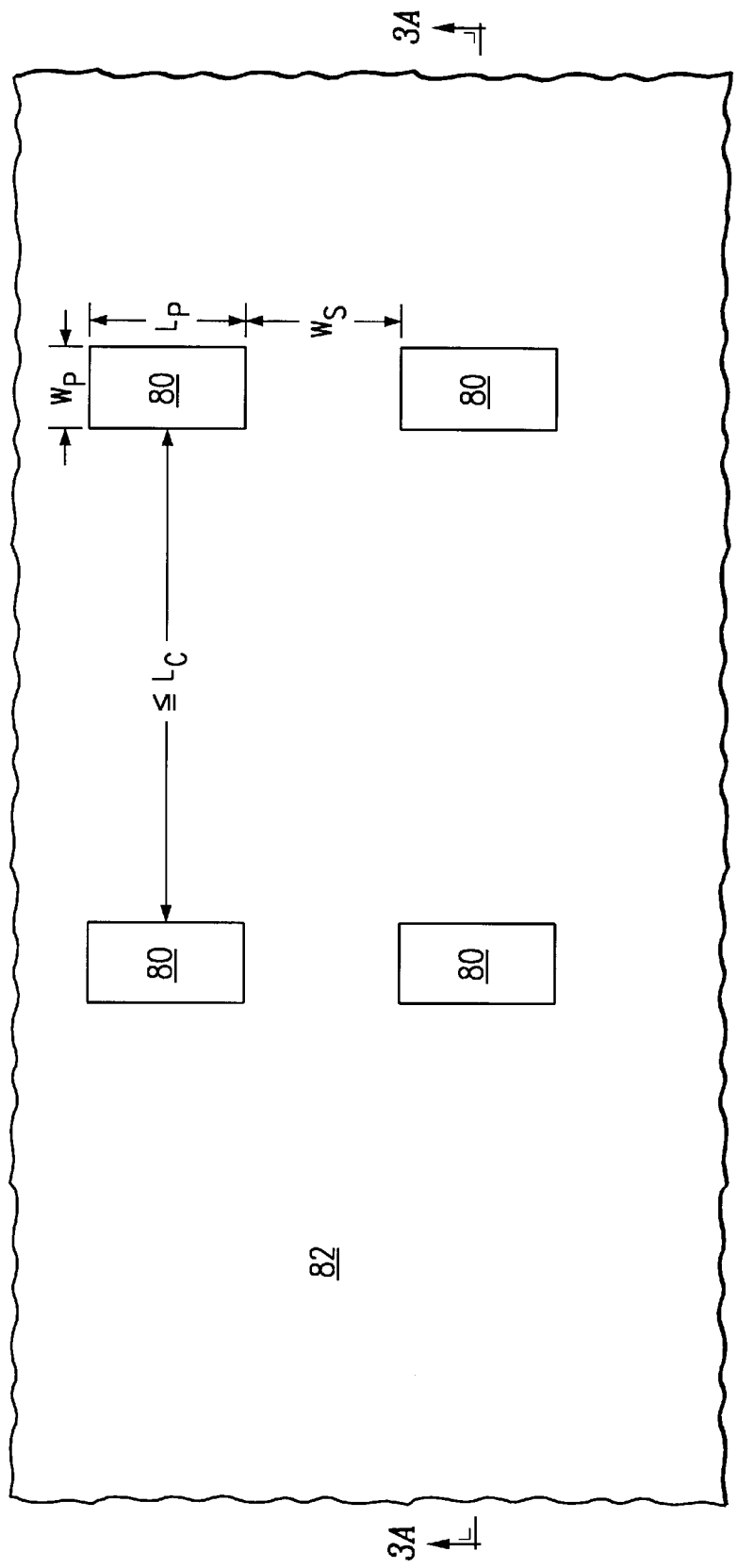

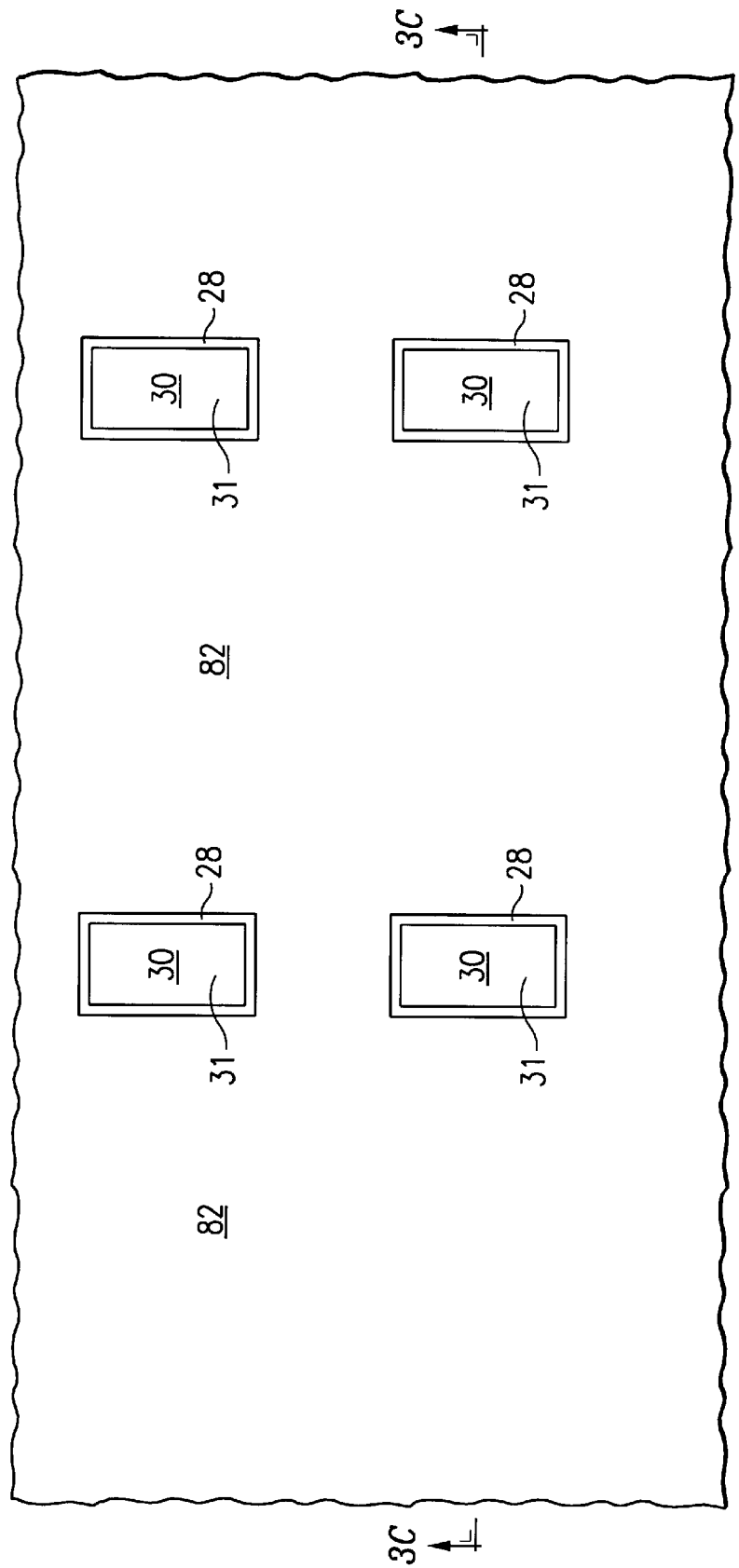

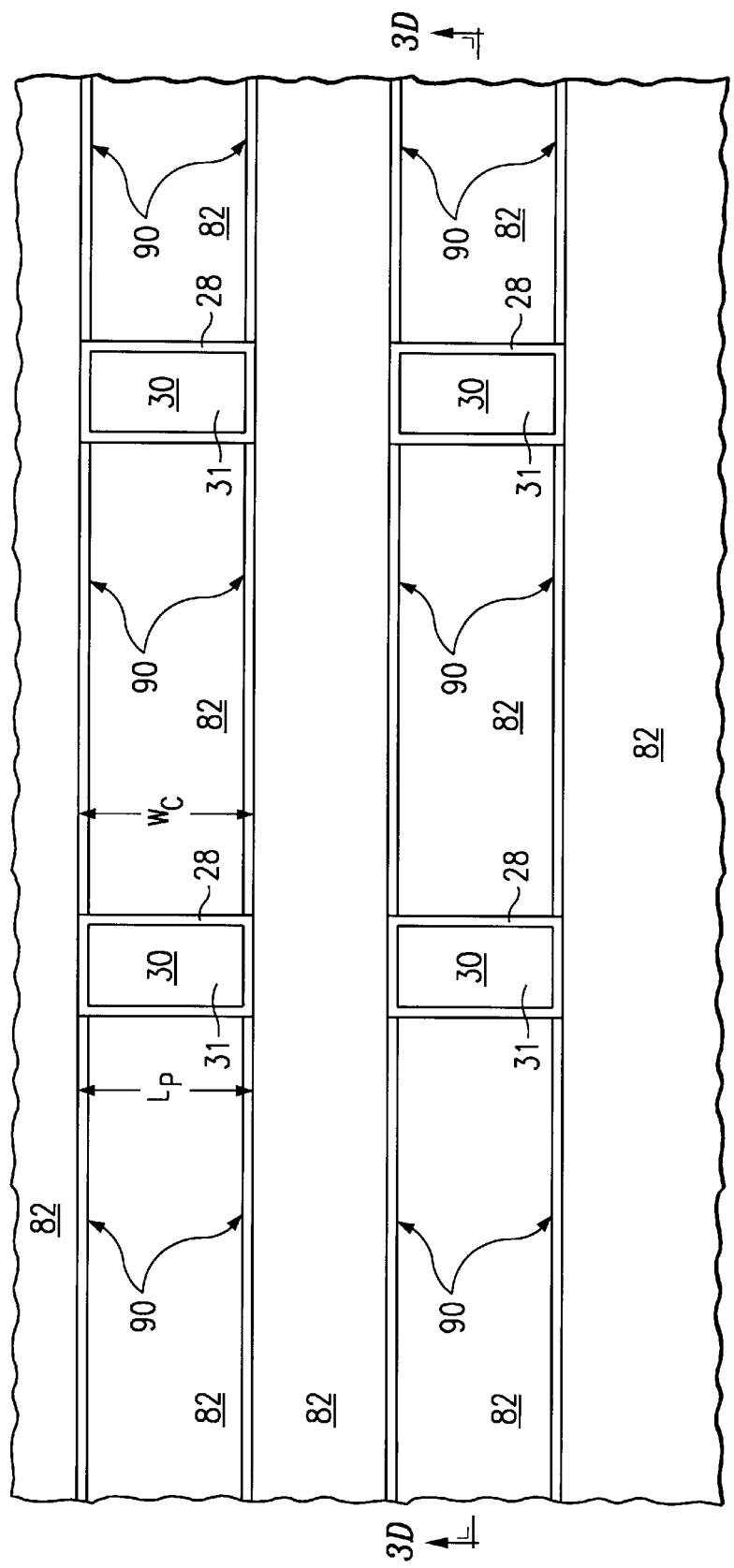

ELECTRICAL INTERCONNECT STRUCTURE HAVING ELECTROMIGRATION-INHIBITING SEGMENTS

This application is a continuation of application Ser. No. 08/722,532 filed Sep. 27, 1996, abandoned.

BACKGROUND OF THE INVENTION

This invention relates generally to metallization systems and methods and more particularly to metallization systems and methods suitable for use with very large scale integrated (VLSI) circuits. More particularly, the invention relates to metallization systems having increased electromigration (EM) resistance.

As is known in the art, electromigration (EM) in on-chip electrical interconnects is one of the wearout mechanisms which limit the lifetime of integrated circuits. On-chip interconnects are typically made of highly-conductive, polycrystalline metal films, such as aluminum, copper, or their alloys. In such films, electromigration typically proceeds along the network of grain boundaries. EM failures, in the form of voids or hillocks, usually occur at certain grain-boundary intersections, called "triple points", where flux divergence exists, i.e., the flux of metallic atoms entering the intersection is different from the flux of atoms leaving this intersection. However, EM failure is even more likely to occur at the end of a metal conductor where it is attached to an interlevel contact or via. At the same time, as discussed in a paper entitled, "Electromigration in thin aluminum films on titanium nitride" by I. A. Blech, published in the Journal of Applied Physics, Vol. 47, No. 4, April 1976, pages 1203–1208, EM voids and hillocks cannot develop in metal lines or conductors which are shorter than a certain "critical length". The "critical length" effect was observed in Al/W/Al via chains as reported in "Evidence of the electromigration short-length effect in aluminum-based metallurgy with tungsten diffusion barriers" by Ronald G. Filippi et al, Proceedings of MRS Symposium, Vol. 309, 1993 pages 141–148 and in a paper entitled "Permitted Electromigration of Tungsten-Plug vias in Chain for Test Structure with Short Inter-Plug Distance", by T. Aoki et al., published in Proceedings of VMIC Conference, 1994 beginning at page 266. The critical length effect in all-aluminum lines with poly-crystalline segments has been reported in a paper entitled "Two Electromigration Failure Modes in Polycrystalline Aluminum Interconnects", by E. Atakov, J. J. Clement and B. Miner, published in the Proceeding of the IRPS, 1994, beginning at page 213. At typical operating conditions of silicon integrated circuits, the critical length is expected to be at least 100 um, as discussed in the above reference papers.

Prolongation of the lifetime of a contact to the silicon substrate by forming a gap in one layer of a multilayered metal line within the critical distance from the contact, and filling the gap with a refractory metal has been reported in a paper entitled "An Increase of the Electromigration Reliability of Ohmic Contacts by Enhancing Backflow Effects", by Wei Zhang, et al., Proceedings of the IRPS, 1995, beginning at page 365. As described in the Zhang et al. paper, a 4000 Å thick Al-1% Si electrically conductive film is deposited over a 4700 Å thick dielectric layer and through a contact opening formed in a region of a dielectric layer to make electrical contact with an electric device formed in a semiconductor body, as shown in FIG. 1 of the paper. The Al-1% Si layer is patterned to form a stripe which is attached to the contact and has a gap at a critical distance, $L_c$, from the contact. A 3200 Å thick trilevel metallization layer made of 100 Å thick Ti, 3000 Å thick W, 100 Å thick Ti is deposited over the substrate, covering the Al-1% Si stripe and filling the gap. Next a 4000 Å thick Al-1% Si layer is deposited over the surface. Because the gap presumably has a depth of the thickness of the first Al-1% Si layer (i.e., a depth of 4000 Å), it appears that the resulting metal surface is non-planar.

The two top metallization layers are patterned to form a stacked stripe coincident with the first Al-1% Si stripe. The first stripe itself is non-planar, making it difficult to perform photolithography to align the stacked stripe. Because of non-planarity, the process described by Wei Zhang, et al. does not ensure the dimension control which is required to fabricate devices with submicron feature size. Particularly, it cannot easily be used to fabricate the conductors in high-performance, state-of-the-art Very Large Integrated Circuits (VLSI).

One of the requirements for metal interconnects in such circuits is that the equidistant conductors be spaced at submicron distance. Very tight dimensional control is required for the fabrication process to ensure such small distance without causing unintended electrical shorts between the conductors.

Also, the structure proposed by Wei Zhang et al., does not provide complete blocking of electromigration, because aluminum can migrate away from the contact in the top conducting layer of Al-1% Si. On the other hand, even though the gap can somewhat prolong the life of the nearby contact, the gap itself creates a flux divergence and is a likely site for an EM failure.

Interconnect structures with a plurality of high electrically conductive, electromigration-prone segments separated by very short, electromigration-resistant refractory metal segments were proposed in U.S. Pat. No. 5,439,731, entitled Interconnect Structures Containing Blocking Segments to Minimize Stress Migration and Electromigration Damage, by Li et al., issued on Aug. 8, 1995.

However, Li et al., propose that the high electrically conductive segments be formed first, and the gaps between the segments be filled with EM-resistant metal afterwards. Another photolithography/metal etch step is required to form the intended interconnect structure. This method has the same disadvantage as the method proposed by Wei Zhang, et al.

Conductors in high-performance VLSI are required to have as low electrical resistance as possible. The EM-resistant refractory metals are known to have a lower electrical conductivity than Al, Au, Cu, etc. For this reason, it is critical that the method which is used to form the interconnect structures allow for making the EM-resistant segments as short as possible.

Also for the purpose of reducing the overall resistance of segmented conductors, it is desirable that the high electrically conductive segments be as long as possible, without compromising the conductor reliability. Li et al., propose that the high electrically conductive segments be as short as 5 to 20 microns. However, it was shown that the high electrically conductive segments are immune to electromigration if they are no longer than the critical length, $L_c$. As discussed by I. A. Blech, $L_c$ is inversely proportional to the electrical current density in the conductor, and $L_c$ depends on the physical characteristics of the conductor and the overlying dielectric. $L_c$ can be determined using special experimental techniques. As shown by R. G. Filippi et al.,

SUMMARY OF THE INVENTION

In accordance with the invention, a method is provided for forming at least one electrical conductor having a plurality of relatively high electrically conductive segments separated by, and electrically interconnected through, relatively short electromigration-inhibiting/electrically conductive segments, or plugs. The electromigration-inhibiting/electrically conductive segments are formed within a planar surface. More particularly, windows are formed in the planar surface. The windows are filled with electromigration-inhibiting/electrically conductive material to thereby form the plugs, upper portions of the electromigration-inhibiting/electrically conductive material extending above the planar surface. The upper portions of the electromigration-inhibiting/electrically conductive material extending above the planar surface are removed to form the plugs with surfaces co-planar with the aforementioned planar surface. The plugs are separated from each other by a distance less than, or equal to, a predetermined critical length, $L_c$. Typically, $L_c$ is at least 100 microns, and the electromigration-inhibiting/electrically conductive plugs are shorter, in length, than one micron.

The relatively high electrically conductive segments are formed within the same planar surface as the plugs, either before, or after the plug formation, in such a way that these segments are co-planar with, and abutting, the plugs.

With such method, such formed electrical conductors have improved electromigration resistance, low electrical resistance, and can be readily formed at submicron distance to each other, as required for metallization in high-performance VLSI.

According to one feature of the invention, an electrical conductor is produced by forming a plurality of windows within a planar surface. The windows are aligned along the desired path of the electrical conductor with a space, or distance, between adjacent windows of less than, or equal to, the critical length, $L_c$. The number of windows is equal to or more than $(L/L_c)$-1 where L is the desired length of the conductor. The dimension, $W_p$, of each window along the path of the electrical conductor is the minimum width allowed by the given technology, and preferably should be less than, or equal to, one micron. This dimension is further referred to as the window width. The window dimension orthogonal to the path of the electrical conductor, $L_p$, is at least as large as the desired width, $W_c$, of the electrical conductor. This dimension is further referred to as the window length. The window depth, $D_p$, is approximately the same as the desired thickness, $D_c$, of the electrical conductor, and preferably less than, or equal to, one micron.

An electromigration-inhibiting/electrically conductive material is deposited over the planar surface and through the windows to fill the windows. Because of the small width of the windows, the material fills them up completely, with upper portions of such material extending above the planar surface and the windows, and the upper portions of the material deposited above the windows are nearly co-planar with the material deposited above the surrounding planar surface. The upper portion of the material above the windows and the surrounding planar surface is then removed, to form plugs in the windows with surfaces co-planar with the surrounding surface. The relatively high electrically conductive segments are formed within the same planar surface as the plugs, either before, or after, the plug formation with surfaces co-planar with the plugs, aligned with and abutting the plugs, and electrically interconnected through the plugs.

Such process sequence ensures a very short length, and, consequentially, low resistance of electromigration-inhibiting segments. With the conductive segments being relatively long, the overall resistance increase caused by the electromigration-inhibiting segmentation is very small. The improved electromigration-inhibiting resistance of the resulting electrical conductors is ensured by keeping the length of the electrically conductive segments equal to or less than the predetermined critical length, $L_c$.

The method also ensures adequate control of the space between equidistant electrical conductors when this space is required to be less than 1 micron. A plurality of equidistant electrical conductors spaced at less than 1 micron can thereby be accurately formed within one layer of metallization using photolithography and dry etching, and multiple layers of metallization can be fabricated in the same way.

In one embodiment of the invention, the planar surface is formed by a relatively high electrically conductive film. The windows, which are at least as deep as the thickness of the relatively high conductive film, are formed in the surface. The electromigration-inhibiting/electrically conductive material is deposited over the conductive film and into the windows formed therein to provide, in such windows, the plugs, an upper portion of such electromigration-inhibiting/electrically conductive material extending above the planar surface and windows. Subsequently, the upper portion of the deposited material is removed to form the plugs with surfaces co-planar with a surface surrounding the plugs. The relatively high electrically conductive film is patterned to form relatively high electrically conductive segments electrically interconnected through the plugs.

In another embodiment of the invention, the planar surface is formed by a dielectric layer. The electromigration-inhibiting/electrically conductive material is deposited over the dielectric layer and into the windows formed therein to provide the plugs, an upper portion of the material extends above the dielectric layer. The upper portion of the deposited electromigration-inhibiting/electrically conductive material extending above the planar surface is removed to form the plugs with surfaces co-planar with the surface of the dielectric layer surrounding the plugs. Trenches are formed in the surface portions of the dielectric film between and aligned with, the plugs. A relatively high electrically conductive material is deposited over the dielectric layer and into the trenches. Subsequently, portions of the deposited electrically conductive material are removed from the dielectric layer to form, in each one of the trenches, corresponding relatively high electrically conductive segments with surfaces thereof co-planar with each other, with the surface of the plugs, and with the surface of the dielectric layer.

In accordance with another embodiment of the invention, the planar surface comprises a dielectric layer having electrical conductors disposed therein. Windows are formed in the electrical conductors thereby separating the electrical conductors into plurality of relatively high electrically conductive segments. The windows are at least as deep as the thickness of the electrical conductors. The electromigration-inhibiting/electrically conductive material is deposited over the dielectric layer, over the electrical conductors and into the windows to provide, in such windows, the plugs, an upper portion of the material extending above the electrical conductor segments and the dielectric layer. The upper portion of the deposited electromigration-inhibiting/ electrically conductive material above the electrical conductive segments and dielectric layer is removed to form the plugs with surfaces co-planar with the surface of the dielectric layer and with surfaces of the relatively high electrically conductive segments.

In accordance with still another feature of the invention, windows are formed within a planar surface. An electromigration-inhibiting/electrically conductive liner and relatively high electrically conductive material are successively deposited into the windows and over the surrounding planar surface, an upper portion of such material extending above the windows and the planar surface. The upper portion of the material extending above the windows and the surrounding planar surface is removed to form plugs in the windows with surfaces co-planar with the surrounding surface. Relatively high electrically conductive segments are formed within the same planar surface as the plugs, either before, or after, the plug formation, so that the surfaces of said segments are co-planar with the plugs, aligned with and abutting the plugs, and electrically interconnected through the plugs. With such an arrangement, the plugs have even smaller resistance than the plugs consisting only of an electromigration-inhibiting/electrically conductive material.

In accordance with still another feature of the invention, a metallization system is provided comprising a plurality of equidistant electrical conductors separated by a distance smaller than 1 micron. Each of the electrical conductors includes a plurality of electrically conductive segments interconnected by much shorter electromigration-inhibiting segments. The conductive segments are co-planar with the electromigration-inhibiting segments. The electromigration-inhibiting segments within each conductor are spaced at a distance less than, or equal to, $L_c$.

In accordance with still another feature of the invention, a multilevel metallization system is provided. Electrical devices are formed in a semiconductor substrate. A dielectric layer is disposed over the semiconductor surface. Windows are formed to open contact regions of the devices. The windows are filled with an electrically conductive material to electrically connect the devices with the first metallization level. The first metallization level comprises first electrical conductors each having a plurality of first electromigration-inhibiting/electrically conducting plugs therein. The first plugs have a space, or distance between adjacent plugs, less than, or equal to, $L_c$. The first plugs have co-planar surfaces. The first electrical conductors comprise pluralities of first electrically conductive segments electrically interconnected through the first plugs. The first electrically conductive segments are co-planar with each other and the first plugs. Electrically conductive vias pass through apertures in a dielectric layer disposed on the first metallization system to electrically interconnect the first metallization level and a second metallization level. The second metallization level includes electrical conductors having each a plurality of second electrically conductive segments electrically interconnected through a plurality of second electromigration-inhibiting/electrically conducting plugs. The second plugs have a space, or distance between adjacent ones thereof, less than, or equal to, $L_c$. The second electrically conductive segments and the second plugs are co-planar. With such an arrangement, the distance between any region of relatively high electrically conductive segments which is near an interlevel via or near a contact to electrical devices, and the nearest electromigration-inhibiting segment never exceeds $L_c$. Thus, electromigration is suppressed in the relatively high conductive segments, even if they are connected to interlevel vias or contacts to electrical devices.

BRIEF DESCRIPTION OF THE DRAWING

Other features of the invention will become more readily apparent with reference to the detailed description below taken together with the accompanying drawings, in which:

FIGS. 1A' and 1B' are plan views of the semiconductor structure of FIGS. 1A and 1B, respectively, the cross sections of FIGS. 1A and 1B being taken along lines 1A—1A and 1B—1B in FIGS. 1A', 1B', respectively;

FIGS. 3A through 3F are diagrammatic cross-sectional sketches of a semiconductor structure at various stages in the fabrication thereof in accordance with an alternative embodiment of the invention;

FIGS. 3A', 3C', and 3D' are plan views of the semiconductor structure of FIGS. 3A, 3C and 3D, respectively, the cross sections of FIGS. 3A, 3C and 3D being taken along lines 3A—3A, 3C—3C, and 3D—3D in FIGS. 3A', 3C, and 3D, respectively;

DESCRIPTION OF THE PREFERRED EMBODIMENTS

Figure 1D:
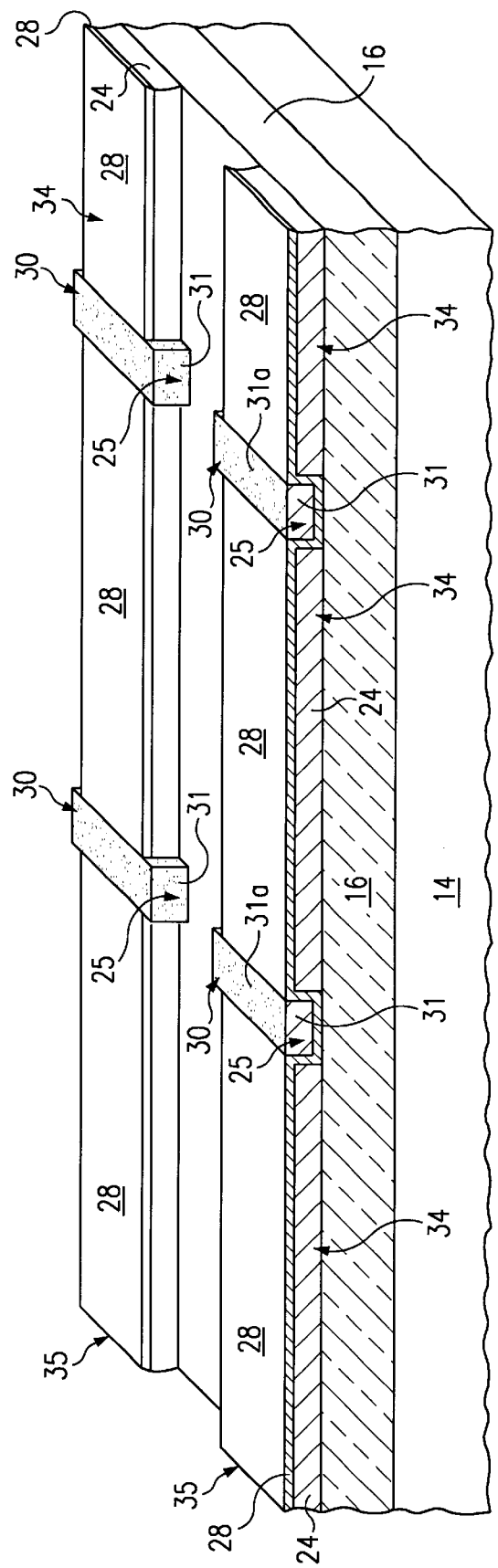
FIG. 1D' is a plan view of the semiconductor structure of FIG. 1D in accordance with one embodiment of the invention.
Figure 1A:
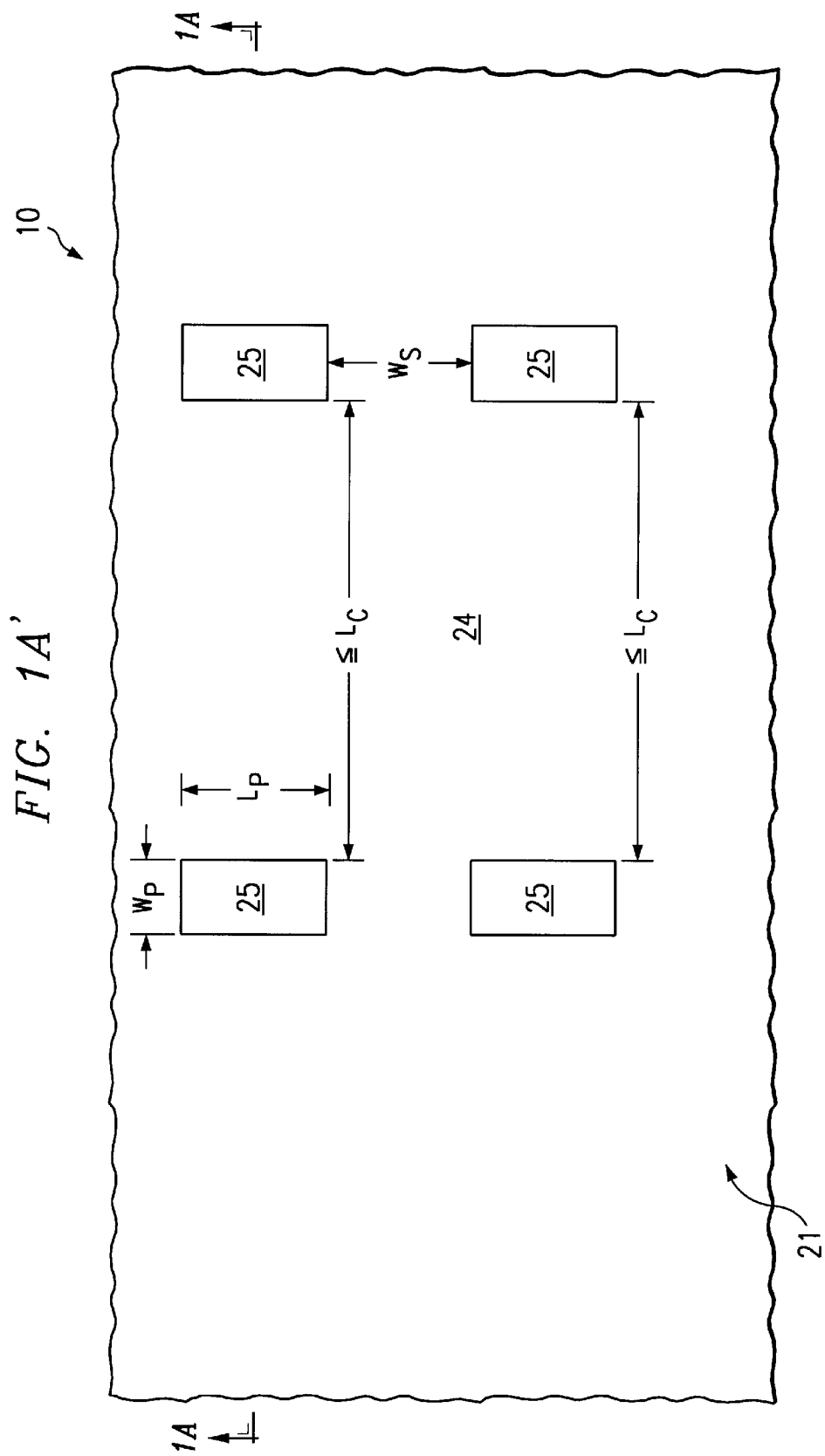
FIGS. 1A though 1D are diagrammatic cross-sectional sketches of a semiconductor substrate with a metallization system at various stages in the fabrication thereof in accordance with the invention, FIGS. 1A, 1B, 1C being cross-sectional elevation view sketches and FIG. 1D being a cross-sectional perspective view sketch.
Figure 1D:
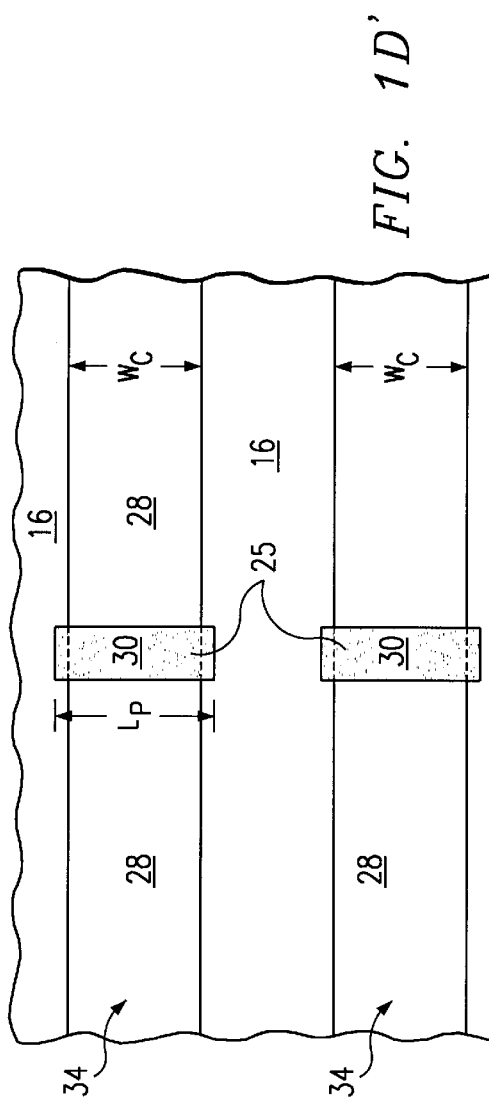

Referring now to FIG. 1A, a semiconductor structure 10 is shown having a silicon layer 14, and a silicon dioxide layer 16 as shown. A 0.6 micron thick film, or layer 24 of a relatively high electrically conductive material, here an aluminum-copper (Al-Cu) alloy is evaporated over the surface. Other material may be used for film 24, such as Al, Cu, Au, Ag, or their alloys, the electrically conductive film 24 need not be immune to electromigration. The film 24 alternatively may be a multi-layer structure having one or more additional layers made of conductive materials, such as indicated above, and/or of refractory metals or their compounds, such as Ti, W, TiN, TiW, Mo, Ta, or others, which are known to be immune to electromigration at typical operating conditions of silicon integrated circuits. It is noted that the upper surface of film 24 is a planar surface 21.

Multiple equidistant rows of windows are formed so that they are aligned along the desired paths of conductors. Minimum-width ($W_p$) windows 25 (i.e. windows 25 formed with the minimum width practical within the photolithography and etch processes available) are opened in conductive film 24 by conventional photolithography and dry etching as shown in FIG. 1A'. Here, $W_p=0.25$ μm. The depth, $D_p$, of windows is at least as large as the electrical conductor thickness, $D_c$, here $D_p=D_c=0.6$ μm. Within each conductor path, the windows 25 are spaced at a distance less than, or equal to, a predetermined critical length, $L_c$, as shown in FIG. 1A'. The length $L_c$ is selected experimentally, as previously described, to prevent electromigration in the relatively high electrically conductive segments 34 to be patterned in conductive film 24, as will be described in detail in connection with FIG. 1D. The electromigration is prevented by creating a backflow in the relatively high electrically conductive segments 34 which counter-balances electromigration flow. In integrated circuits with submicron feature size, $L_c \gg W_p$. Here, $L_c$ is 100 to 300 microns. The number of windows in each of the desired conductor paths is at least $(L/L_c)-1$, where L is a desired conductor length. The length, $L_p$, (FIG. 1A') of each one of the windows 25 is selected so as to be at least as large as the desired width, $W_c$, (FIG. 1D') of relatively high electrically conductive segments 34 to be patterned in conductive film 24, as will be described in detail in connection with FIG. 1D. Here, $W_c=0.5$ μm. The space $W_s$ between windows belonging to neighboring conductors can be as small as allowed by photo-etch (FIG. 1A'). Here, $W_s=0.25$ μm.

Referring again to FIG. 1A and 1A', after a layer of photoresist, not shown, deposited over the surface of the structure and used to form the windows 25 is stripped off, a refractory metal liner 28 (FIG. 1B) and a metal layer 30 are successively deposited over the structure, filling the windows 25 as shown in FIGS. 1B and 1B' to provide electromigration-inhibiting/electrically conductive plugs 31. Liner 28 is here sputter deposited or chemically vapor deposited, and metal layer 30 is here sputter deposited, chemically vapor deposited, electroplated or electroless plated. The specific resistivity, $RHO_p$, of conductive layer 30 should preferably be equal to, or less than, four times the specific resistivity, $RHO_o$, of relatively high electrically conductive layer 24. While conductive layer 30 does not have to be immune to electromigration, liner 28 does have to be immune to (i.e., act as a barrier against) electromigration, such as a refractory metal. In fact, conductive layer 30 need not be different from conductive layer 24. Here, the conductive layer 30 is a 0.4 micron thick layer of tungsten and the liner 28 is here a 0.025 micron thick layer of titanium and titanium nitride. Here, the titanium is 0.01 microns thick and the titanium nitride is 0.015 microns.

Next, referring to FIG. 1C, the conductive layer 30 is etched back using plasma etching, to form a surface co-planar with the surface of liner 28 surrounding plug 31; i.e., to form a planar surface over the plugs 31. That is, portions of the electromigration-inhibiting/electrically conductive material filing the windows 25, here an upper portion of the conductive layer 30, is removed to form the plugs 31 with surfaces co-planar with each other and with the surface of the liner 28 surrounding the plugs 31. Portions of the liner 28 may or may not be removed as well. Layer 30 and liner 28 may also be removed by chemical-mechanical polishing (CMP) techniques.

Electrical conductive segments 34, are formed within the relatively high electrically conductive layer 24 and overlying refractory metal liner 28, as shown in FIG. 1D using photolithography and plasma etching techniques. It is noted that the patterning is such that the patterned electrically conductive segments abut the corresponding plugs 31, as shown in FIG. 1D. Thus, the electrically conductive segments 34 are electrically interconnected through the plugs 31. A top view of the structure is shown in FIG. 1D'. It is noted that the length, $L_p$, of plug 31 is equal to, or greater than, the width $W_c$ of the conductor segments 34, as shown in FIG. 1D'. Here, $L_p=0.5$ μm.

Thus, in summary, a method is provided for forming electrical conductors 35 with electromigration-inhibiting/electrically conductive plugs 31 disposed between electrically conductive segments 34, as shown in FIGS. 1D and 1D'. The plugs 31 are formed by depositing the electromigration-inhibiting/electrically conductive material (i.e., liner 28 and conductor 30) into windows 25 and subsequently removing portions of the deposited material, here conductive material 30, to form plugs 31 with surfaces co-planar with the surface of the liner 28 surrounding the plugs 31. In accordance with such method, the windows 25 are formed within a planar surface 21 of film 24. The electrically conductive segments 34 have surfaces co-planar with the plugs 31, abut the plugs 31, and are electrically interconnected through the plugs 31. The plugs 31 are formed at a distance less than, or equal to, the predetermined critical length, $L_c$, from each other. The length, $L_p$ of the plug 31 is not less than the desired width, $W_c$, of the electrically conductive segments 34. The conductors formed in such a way have improved electromigration resistance, because the length of relatively high electrically conductive segments is less than, or equal to, $L_c$.

The relative increase in conductor electrical resistance associated with the electromigration-inhibiting plugs is calculated as $(R-R_o)/R_o=RHO_p W_p/RHO_o L_c$, where R and $R_o$ are, respectively, the resistances of conductor 35 and a same-length conductor without the plugs, and $RHO_p$ and $RHO_o$ are the specific resistivities of the electromigration-inhibiting conductive material 30 and the relatively high electrically conductive material 24, respectively. Here, $RHO_p=8\times10^{-6}$ Ohm-cm, $RHO_o=3\times10^{-6}$ Ohm-cm, $W_p=0.25$ um, and $L_c=100$ μM. Then, $(R-R_o)/R_o=7\times10^{-3}=0.7\%$. So, the electrical conductors 35 formed by the described method have low electrical resistance, which does not exceed the resistance of solid relatively high electrically conductive conductors by more than 1%. With the described method, a planar surface is provided along the conductor film 24 for accurately photolithographically forming equidistant conductors 35 at a distance smaller than 1 micron.

Figure 2:
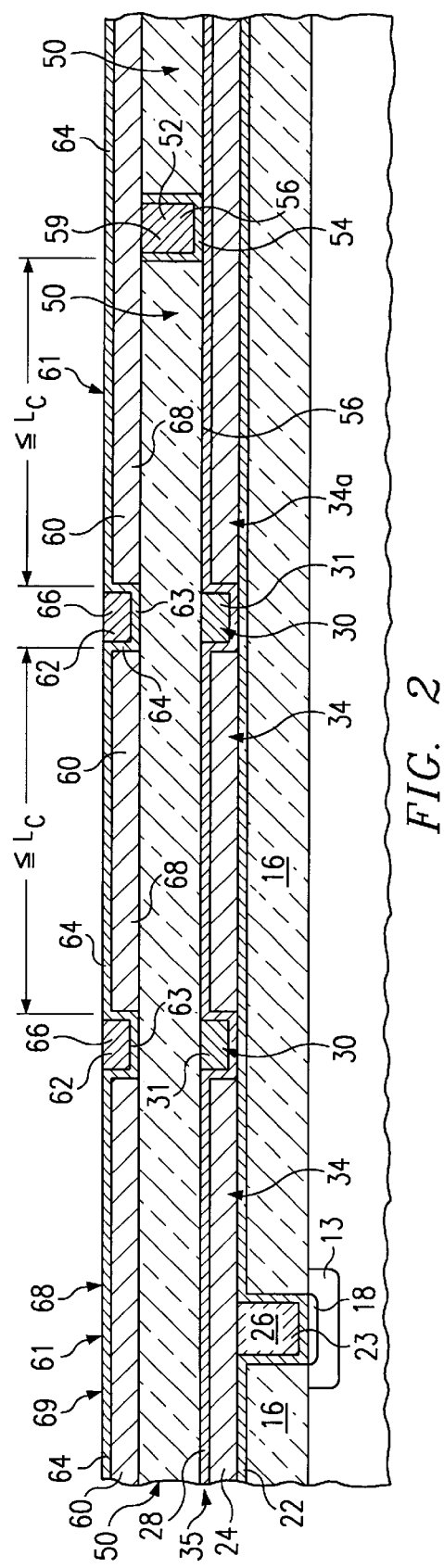
FIG. 2 is a diagrammatical cross-sectional sketch of a multilevel metallization system according to the invention.

Referring now to FIG. 2, the semiconductor structure 10 is shown having an electrical device, here a metal oxide silicon (MOS) transistor, only the drain region 13 thereof being shown, formed in a silicon layer 14, as shown. Disposed over the silicon layer 14 is a dielectric layer 16, here silicon dioxide. A contact opening, or recess 26, is etched into a portion of the dielectric layer 16 to expose a contact region 18 of the drain 13. A thin layer 22 of a refractory metal, here titanium (Ti) and titanium nitride (TiN) is sputtered over the surface and into the recess 26 to a total thickness here of 0.025 microns. A layer 23 of a second metal, here tungsten, is deposited over the surface to fill the recess 26, as indicated; excess tungsten being removed by etch-back or CMP. The Ti/TiN may or may not be removed as well. In this way, contacts to silicon, Si, devices are formed. Next, a 0.6 micron thick film, or layer 24 of a highly conductive material, here an aluminum-copper (Al-Cu) alloy is evaporated over the surface. Other material may be used for film 24, such as Al, Cu, Au, Ag, or their alloys. The film 24 may be a multi-layer structure having one or more additional layers made of refractory metals or their compounds, such as Ti, W, TiN, TiW, Mo, Ta, or others, which are known to be immune to electromigration at typical operating conditions of silicon integrated circuits. It is noted that the upper surface of film 24 is a planar surface 21. The first metallization level comprised of conductors 35 and described above in connection with FIGS. 1A through 1D, is formed. Then, a second dielectric layer 50, here silicon dioxide layer, is deposited over the surface of the structure, as shown. An opening 52 is formed therein to expose a portion of the electrically conductive segment 34a of electrical conductor 35. A layer 54 of titanium and TiN followed by a layer 56 of tungsten are deposited in a manner similar to that described above in connection with layers 22 and 26. The materials of layers 54, 56 are removed to form planar surface, by plasma etch or chemical-mechanical polishing (CMP). Next, a second relatively high electrically conductive film, or layer 60 is formed in the same manner as film, or layer 24. It is noted that the bottom portion of conductive layer 60 is in electrical contact with the via 59 provided by titanium/TiN layer 54 and tungsten layer 56. Here, the conductive layer 60 is electrically connected to conductive segment 34a of conductor 35. The process sequence shown in FIGS. 1B, 1B', 1C, 1D and 1D' is then repeated. That is, film 60 has a planar upper surface 61. Windows 62 are formed in the planar surface 61 of conductive film 60 at the space, or distance, $L_c$, along the desired conductor path. The conductor is routed in such a way that it overlaps the via 59. An electromigration-inhibiting/electrically conductive material (i.e., liner 64 and conductive material 66) is deposited over the planar surface 61 and through the windows 62 to fill the windows 62 and thereby provide, in such windows 62, plugs 63 of the electromigration-inhibiting/electrically conductive material. Portions of the electromigration-inhibiting/electrically conductive material 66 are removed to form the plugs 63 with surfaces co-planar with the planar surface of the liner 64. The film 60 and liner 64 are then patterned into electrical conductor segments 68 in the same manner film 24 was patterned into electrical conductor segments 34. Electrical conductive segments 68, of conductor 69 are formed with surfaces co-planar with the plugs 63, and segments 68 are electrically interconnected through the plugs 63. The plugs 63 are formed with a space, or distance between adjacent plugs 63 less than, or equal to, the predetermined critical length, $L_c$, from each other. The number of plugs in each of conductors 69 is at least $(L/L_c)-1$, where L is the length of conductor 69. The length, $L_p$, of the each plug 63 is not less than the desired width, $W_c$, of the electrically conductive segments 68. Equidistant conductors can be formed at a distance $W_s$ smaller than 1 um. Here, $W_s=0.25\,\mu m$. The vias 26, 59 are within $L_c$ distance from the nearest plug 31 in the first layer or plug 63 in second layer, respectively. The windows have minimum width, $W_p=0.25\,\mu m$, and length $L_p$ no less than conductor width, $W_c=0.5\,\mu m$. Windows are as deep, $D_p$, as desired electrical conductor thickness, $D_c$. Here, $D_p=D_c=0.6\,\mu m$.

Referring now to FIGS. 3A through 3F, an alternative embodiment is shown. Multiple equidistant rows of minimum-width recessed areas are formed, so that they are aligned along the desired paths of conductors. The number of recessed areas in each row is equal to or more than $(L/L_c)-1$ where L is the desired length of each respective conductor. Here, minimum-width recessed areas (i.e. windows 80) are formed in a planar surface 79 of a film 82, here a dielectric layer 82, by photolithography and dry etching; the dielectric layer 82 having been deposited over the semiconductor layer 14, as shown. The windows 80 are spaced at the predetermined critical distance, $L_c$, described above in connection with FIG. 1A, to inhibit electromigration, as shown in FIGS. 3A and 3A'.

Referring to FIG. 3B, a refractory metal, here titanium and TiN liner 28 and conductive, here tungsten, layer 30 are deposited over the structure as described above in connection with FIG. 1B; here, however the liner 28 and layer 28, 30 are deposited over silicon dioxide layer 82 rather than the relatively high electrically conductive layer 24 as described in connection with FIG. 1B. More particularly, a refractory metal liner 28 (FIG. 3B) and a metal layer 30 are successively deposited over the structure, filling the windows 80 as shown in FIG. 3B to provide electromigration-inhibiting/electrically conductive plugs 31. Liner 28 is here sputter deposited or chemically vapor deposited, and metal layer 30 is here sputter deposited, chemically vapor deposited, electroplated or electroless plated. While, as discussed above, conductive layer 30 does not have to be immune to electromigration, liner 28 does have to be immune to (i.e., act as a barrier against) electromigration, such as a refractory metal. In fact, conductive layer 30 may not be different from conductive layer 24 in FIGS. 1A–1D. Here, the conductive layer 30 is a 0.4 micron thick layer of tungsten and the liner 28 is here a 0.025 micron thick layer of titanium and titanium nitride. Here, the titanium is 0.01 microns thick and the titanium nitride is 0.015 microns.

Next, referring to FIG. 3C, the conductive layer 30 is etched back using plasma etching, or polished back to form a surface co-planar with the surface of dielectric layer 82 surrounding plugs 31; i.e., a planar surface over the plugs 31. That is, portions of the electromigration-inhibiting/electrically conductive material filing the windows 80, here an upper portion of the conductive layer 30 and liner 28 are removed to form the plugs 31 with surfaces co-planar with each other and with the surface of the dielectric layer 82 surrounding the plugs 31. The conductive layer 30 and the portions of liner 28 disposed on the planar surface 79 of dielectric layer 82 are removed using plasma etch-back or chemical-mechanical polishing (CMP) so the surface of plugs 31 is co-planar with the upper surface 79 of the dielectric layer 82, as shown in FIGS. 3C and 3C'.

Referring now to FIG. 3D, trenches 90 are formed in the dielectric layer 82 using photo-lithography and dry etching. The trenches 90 are formed in such a way that they are aligned with, and abutting, the plugs of each separate row of the plugs. It is noted that the end-walls 92 of the trenches 90 abut the liner 28. Trenches have width equal to desired conductor width, $W_c$. Here, $W_c=0.5\,\mu m$.

Referring now to FIG. 3E, a refractory, electromigration-inhibiting liner 98, here titanium and TiN and a relatively high electrically conductive layer 100, here Al(Cu), are deposited over the structure in a manner described above in connection with layers 28, 30 (FIG. 1B) (e.g., here such deposition being chemical vapor deposition (CVD), electroplating, reflow-sputtering, or other deposition process). Subsequently, an upper portion of liner 98 and layer 100 are removed (e.g., etch-back, lift-off, CMP, or other) to form a relatively high electrically conductive segments 102, as shown in FIG. 3F. The segments 102 have a surface which is co-planar with the surface of plugs 31.

Thus, a method is provided for forming electrical conductors 103 with electromigration-inhibiting/electrically conductive plugs 31 disposed between electrically conductive segments 102. Windows 80 are formed within a planar surface 79 of dielectric layer 82. An electromigration-inhibiting/electrically conductive material (i.e., liner 28 and conductive material 30) is deposited over the planar surface 79 and through the windows 80 to fill the windows 80 and thereby provide, in such windows 80, plugs 31 of electromigration-inhibiting/electrically conductive material. Portions of the electromigration-inhibiting/electrically conductive material 28, 30 are removed to form the plugs 31 with surfaces co-planar with the planar surface 79. The electrical conductive segments 102 are formed with surfaces co-planar with the plugs 31, and segments 102 are electrically interconnected through the plugs 31. The plugs 31 are formed with a space, or distance between adjacent plugs 31 less than, or equal to, the predetermined critical length, $L_c$. The length of the plug 31 $L_p$ is approximately equal to the desired width of the electrically conductive segments 102, $W_c$ as shown in FIG. 3D'. Here, $W_c=0.5$ μm. It is noted that, here, $L_p$ is approximately equal to $W_c$ and $D_p$ is approximately equal to $D_c$.

Referring now to FIGS. 4A through 4E, another method is provided for forming conductors 111 (FIG. 4E) with electromigration-inhibiting/electrically conductive plugs 31 disposed between electrically conductive segments 110.

Figure 4A:
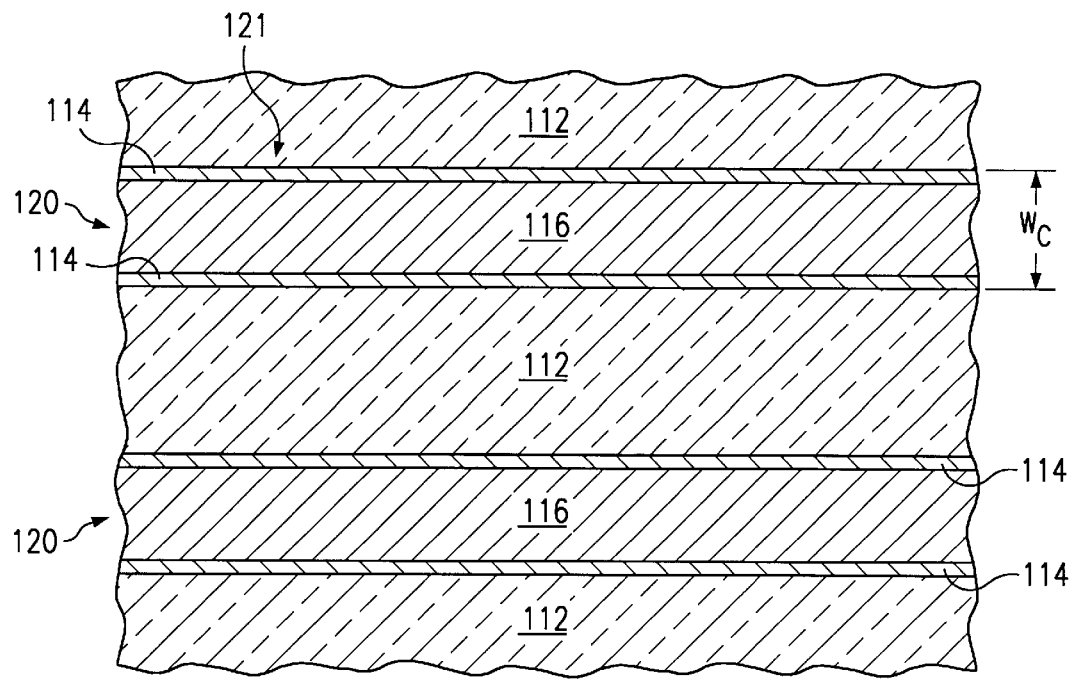
FIGS. 4A through 4E are plan and cross-sectional view sketches of a semiconductor structure at various stages in the fabrication thereof in accordance with an alternative embodiment of the invention, FIGS. 4A and 4E being plan view sketches and FIGS. 4B through 4D being cross-sectional elevation view sketches.

Referring to FIG. 4A, conductor-length slots, or trenches, 120 are formed in the dielectric layer 112 by photolithography and dry etching. The slots 120 are filled with refractory metal liner 114 and relatively high electrically conductivity conductor 116, as shown. The upper surfaces of the dielectric layer 112, liner 114 and conductor 116 are formed to provide a planar surface 121. Here, the slot width (i.e., electrical conductor width), $W_c$, equals 0.5 μm.

Figure 4B:
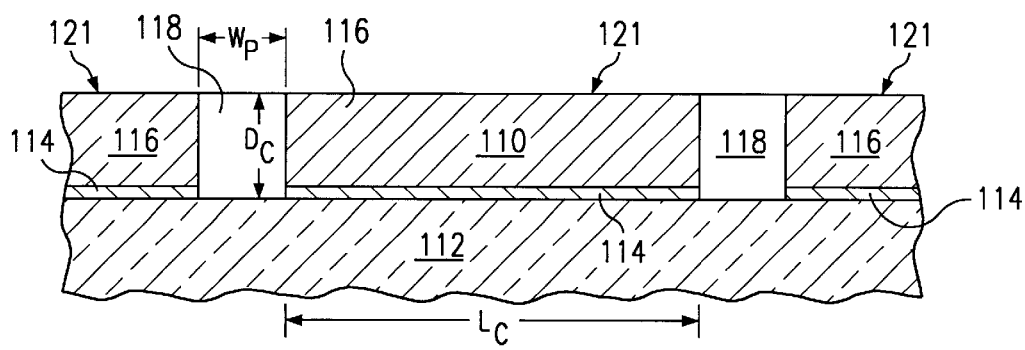
Figure 4C:
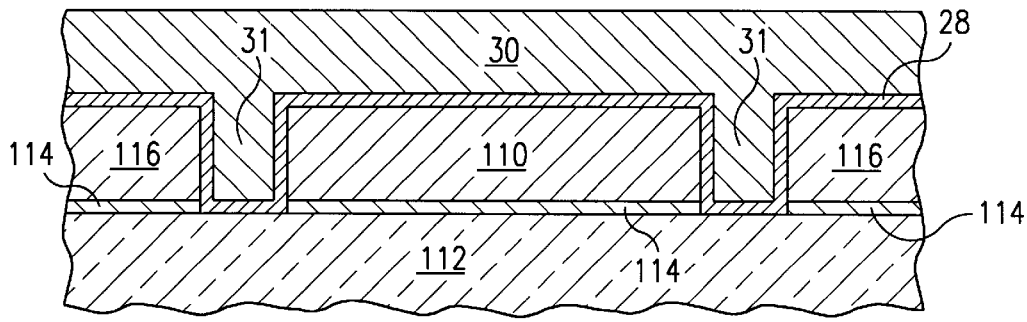

Minimum-width windows 118 (FIG. 4B), ($W_p=0.25$ μm) are formed in the planar surface 121; more particularly in liner 114 and conductor 116 at the predetermined critical distance, $L_c$, as shown in FIG. 4B. The windows 118 separate conductors 116 and liner 114 into segments 110, as shown in FIG. 4E. The window length, $L_p$, is equal to, or greater than, $W_c$; and the window depth $D_p$ is equal to, or greater than, $D_c$, as shown in FIG. 4B. The windows 118 are filled with a electromigration-inhibiting/electrically conductive material (FIG. 4C), here liner 28 and a conductor 30, as described above in connection with 1B. Thus, a refractory metal liner 28 and a metal layer 30 are successively deposited over the structure, filling the windows 118 as shown in FIGS. 1B and 1B' to provide electromigration-inhibiting/electrically conductive plugs 31. Liner 28 is here sputter deposited or chemically vapor deposited, and metal layer 30 is here sputter deposited, chemically vapor deposited, electroplated or electroless plated. While, as discussed above, conductive layer 30 does not have to be immune to electromigration, liner 28 does have to be immune to (i.e., act as a barrier against) electromigration, such as a refractory metal. In fact, conductive layer 30 may not be different from conductive layer 116. Here, the conductive layer 30 is a 0.4 micron thick layer of tungsten and the liner 28 is here a 0.025 micron thick layer of titanium and titanium nitride. Here, the titanium is 0.01 microns thick and the titanium nitride is 0.015 microns.

Figure 4D:
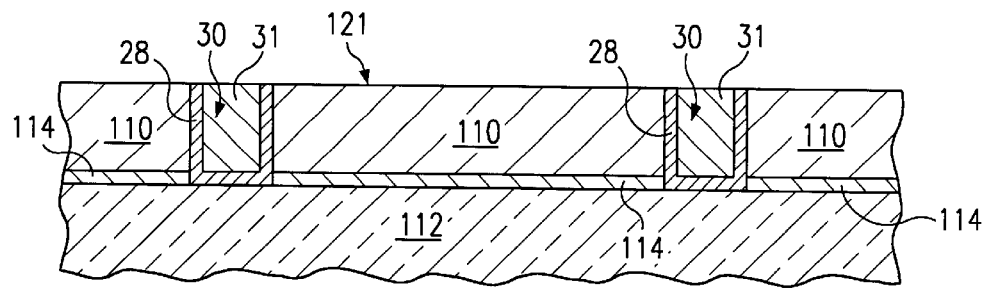
Figure 4E:
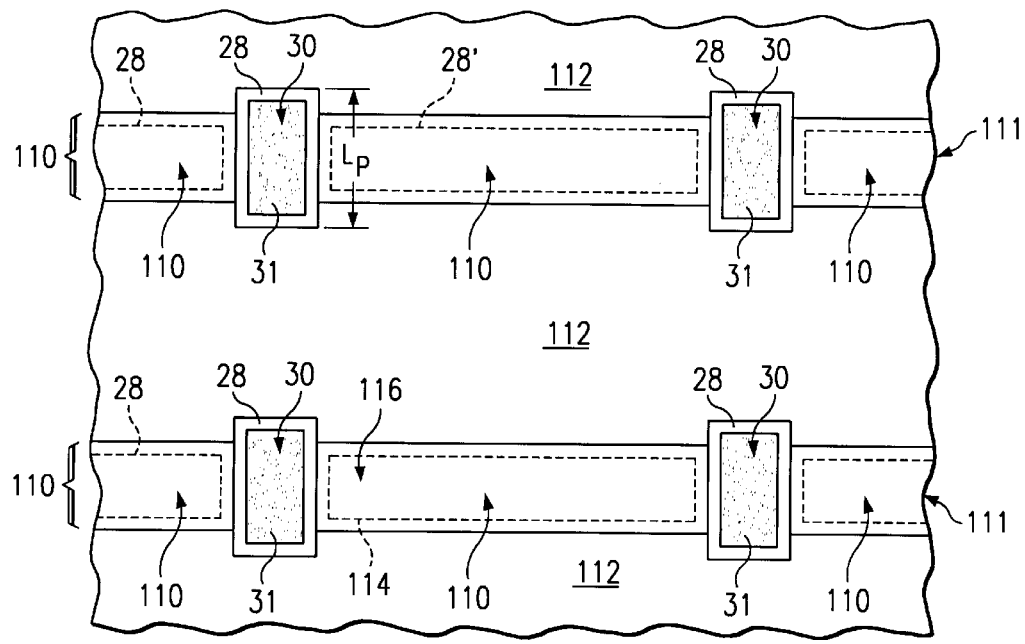

Subsequently, conductive material 30 and liner 28 are etched back or polished back as shown in FIG. 4D to form the plugs 31 with surfaces co-planar with the surrounding surface 121, as shown in FIG. 4D. The plugs 31 provide electrical interconnection between abutting electrically conductive segments 110 forming electrical conductors 111, as shown in FIG. 4E.

Alternatively, liner 28 is not removed. Then, photomask, not shown, is used to remove liner 28 from the portions of the dielectric layer 112 surrounding the slots 120 to form electrically isolated parallel conductors 111, as shown in FIG. 4E.

Figure 5:
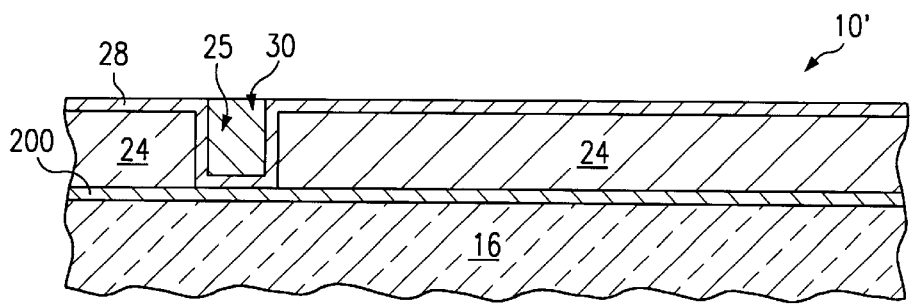
FIG. 5 is a diagrammatical cross-sectional elevation view of a metallization system according to an alternative embodiment of the invention.

Other embodiments are within the spirit and scope of the appended claims. For example, considering the embodiment described above in connection with FIGS. 1A through 1D, if a conductive underlayer, such as conductive underlayer 200 in FIG. 5, is used beneath the relatively high electrically conductive layer 24, the window 25 need only be etched through the layer 24 to the underlayer 200, as shown in FIG. 5.

What is claimed is:

1. An electrical conductor comprising:
   a plurality of electrically conductive segments of length Lc; and
   a plurality of electromigration-inhibiting/electrically conductive plugs disposed between and electrically coupled to the segments, such that said segments have lengths significantly greater than said plugs;
   wherein the electrical conductor has a length, L, and wherein the number of plugs is equal to or more than $(L/L_c)-1$, where $L_c$ is a predetermined critical length not less than 100 microns, selected to inhibit electromigration.

2. The electrical conductor recited in claim 1, wherein $(R-R_o)/R_o$, equal to $RHO_p W_p / RHO_p L_c$, is less than 0.01, wherein R is the resistance of said conductor including said plurality of conductive segments and said plugs, $R_o$ is the resistance of the same-length conductor without said plugs, $RHO_p$ and $RHO_p$ are respectively the specific resistivities of the material of the electromigration-inhibiting/electrically conductive plugs and of the material of the electrically conductive segments, and $W_p$ is the dimension of a said plug in the direction of the length dimension $L_c$.

3. An electrical conductor comprising:
   a plurality of elongated electrically conductive segments each having a length not less than 100 microns, said segments having end walls separated by intervening electromigration-inhibiting/electrically conductive plugs, each plug spacing neighboring segments by a distance significantly less than the length of a segment;
   said plugs comprising:
   an electromigration-inhibiting/electrically conductive liner abutting end walls of neighboring elongated segments; and
   an electrically conductive material filling the liner.

4. The conductor of claim 3, wherein each of the plurality of segments is coplanar with other ones of the plurality of segments and wherein each of the plurality of segments is co-planar with each of the plugs.

5. The conductor of claim 3, wherein the electrically conductive segments comprise a metal selected from the group consisting of Al, Cu, Au, Ag, and alloys of such metals.

6. The conductor of claim 3, wherein the electrically conductive segments comprise a multilayer structure including at least one metal layer selected from the group consisting of Al, Cu, Au, Ag, and alloys of such metals, and at least one layer comprising a refractory metal or a refractory metal compound.

7. The conductor of claim 3, wherein said plugs separate neighboring conductive segments by less than about one micron.

8. An electrical conductor comprising:
   a plurality of elongated electrically conductive segments each having a length not less than 100 microns, said segments having end walls separated by intervening electromigration-inhibiting/electrically conductive plugs, each plug spacing neighboring segments by a distance significantly less than the length of a segment;
   said plugs comprising:
   a refractory metal liner abutting end walls of neighboring elongated segments; and
   an electrically conductive material filling the liner, said electrically conductive material having a specific resistivity equal to or less than four times the specific resistivity of a said conductive segment; and wherein said conductive segments and plugs are disposed on a planar surface of an insulating substrate.

9. The conductor of claim 8, wherein said plugs separate neighboring conductive segments by less than about one micron.

10. The conductor of claim 8, wherein said plugs have a liner comprising a layer of titanium and a layer of titanium nitride, and a tungsten filler material.

11. An electrical conductor comprising:
  a plurality of elongated electrically conductive segments each having a length substantially in the range 100 to 300 microns, said segments having end walls separated by intervening electromigration-inhibiting/electrically conductive plugs, each plug spacing neighboring segments by a distance significantly less than the length of a segment;
  said plugs comprising:
    a refractory metal liner abutting end walls of neighboring elongated segments; and
    an electrically conductive material filling the liner, said electrically conductive material having a specific resistivity equal to or less than four times the specific resistivity of a said conductive segment.

12. The electrical conductor of claim 9, wherein the plugs separate neighboring conductive segments by a distance of less than about one micron.

* * * * *